United States Patent
Chaffins et al.

(10) Patent No.: US 11,312,877 B2
(45) Date of Patent: *Apr. 26, 2022

(54) PRETREAT COMPOSITIONS

(71) Applicant: HEWLETT-PACKARD DEVELOPMENT COMPANY, L.P., Houston, TX (US)

(72) Inventors: Sterling Chaffins, Corvallis, OR (US); Kevin P. Dekam, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 938 days.

This patent is subject to a terminal disclaimer.

(21) Appl. No.: 16/074,279

(22) PCT Filed: Oct. 25, 2016

(86) PCT No.: PCT/US2016/058581
§ 371 (c)(1),
(2) Date: Jul. 31, 2018

(87) PCT Pub. No.: WO2018/080436
PCT Pub. Date: May 3, 2018

(65) Prior Publication Data
US 2021/0189164 A1     Jun. 24, 2021

(51) Int. Cl.
*C09D 11/52* (2014.01)
*C09D 11/54* (2014.01)
*B33Y 10/00* (2015.01)
*B29C 64/165* (2017.01)
*B33Y 70/10* (2020.01)
(Continued)

(52) U.S. Cl.
CPC ............ *C09D 11/52* (2013.01); *B29C 64/165* (2017.08); *B33Y 10/00* (2014.12); *B33Y 70/10* (2020.01); *C09D 11/037* (2013.01); *C09D 11/10* (2013.01); *C09D 11/322* (2013.01); *C09D 11/38* (2013.01); *C09D 11/40* (2013.01); *C09D 11/54* (2013.01); *B29K 2101/12* (2013.01); *B29K 2105/251* (2013.01); *B29K 2505/08* (2013.01); *B29K 2995/0005* (2013.01)

(58) Field of Classification Search
CPC ......... C09D 11/00; C09D 11/40; C09D 11/54; C09D 11/322; C09D 11/52; B29C 67/00; B22F 10/00
See application file for complete search history.

(56) References Cited

U.S. PATENT DOCUMENTS 5,340,656 A    8/1994   Sachs et al.
8,663,485 B2   3/2014   Hu et al.
(Continued)

FOREIGN PATENT DOCUMENTS

CN     102081693 A    6/2011
CN     103936392 A    7/2014
(Continued)

*Primary Examiner* — Khanh T Nguyen
(74) *Attorney, Agent, or Firm* — Thorpe, North & Western

(57) ABSTRACT

The present disclosure is drawn to fluid sets, material sets, and 3-dimensional printing systems. A fluid set can include a pretreat composition that includes a salt of an alkali metal with bromide or iodide. The fluid set can also include a conductive fusing agent composition including a transition metal for fusing thermoplastic powder when exposed to electromagnetic radiation.

16 Claims, 3 Drawing Sheets

(51) Int. Cl.
*C09D 11/037* (2014.01)
*C09D 11/10* (2014.01)
*C09D 11/322* (2014.01)
*C09D 11/38* (2014.01)
*C09D 11/40* (2014.01)
*B29K 101/12* (2006.01)
*B29K 105/00* (2006.01)
*B29K 505/08* (2006.01)

(56) References Cited

U.S. PATENT DOCUMENTS

| | | | | |
|---|---|---|---|---|
| 10,926,464 | B2 * | 2/2021 | Chaffins | B22F 10/00 |
| 2007/0238056 | A1 * | 10/2007 | Baumann | B33Y 10/00 |
| | | | | 430/325 |
| 2010/0080910 | A1 * | 4/2010 | Okada | B41M 5/0017 |
| | | | | 427/256 |
| 2010/0302307 | A1 * | 12/2010 | Tahara | C09D 11/54 |
| | | | | 347/21 |
| 2014/0035995 | A1 | 2/2014 | Ghou et al. | |

FOREIGN PATENT DOCUMENTS

| | | |
|---|---|---|
| CN | 105903084 | 8/2016 |
| EP | 3436236 | 2/2019 |
| RU | 2048272 C1 | 11/1995 |
| RU | 2417890 | 10/2009 |
| WO | 2007039450 A1 | 4/2007 |
| WO | WO 2014118783 A1 * | 8/2014 ............. C09D 11/00 |
| WO | WO-2015167530 | 11/2015 |
| WO | 2016022449 A1 | 2/2016 |
| WO | WO2018022034 A1 | 2/2018 |

\* cited by examiner

PRETREAT COMPOSITIONS

BACKGROUND

Methods of 3-dimensional (3D) digital printing, a type of additive manufacturing, have continued to be developed over the last few decades. Various methods for 3D printing have been developed, including heat-assisted extrusion, selective laser sintering, photolithography, as well as others. In selective laser sintering, for example, a powder bed is exposed to point heat from a laser to melt the powder wherever the object is to be formed. This allows for manufacturing complex parts that are difficult to manufacture using traditional methods. However, systems for 3D printing have historically been very expensive, though those expenses have been coming down to more affordable levels recently. In general, 3D printing technology improves the product development cycle by allowing rapid creation of prototype models for reviewing and testing. Unfortunately, the concept has been somewhat limited with respect to commercial production capabilities because the range of materials used in 3D printing is likewise limited. Therefore, research continues in the field of new techniques and materials for 3D printing.

Figure 1:
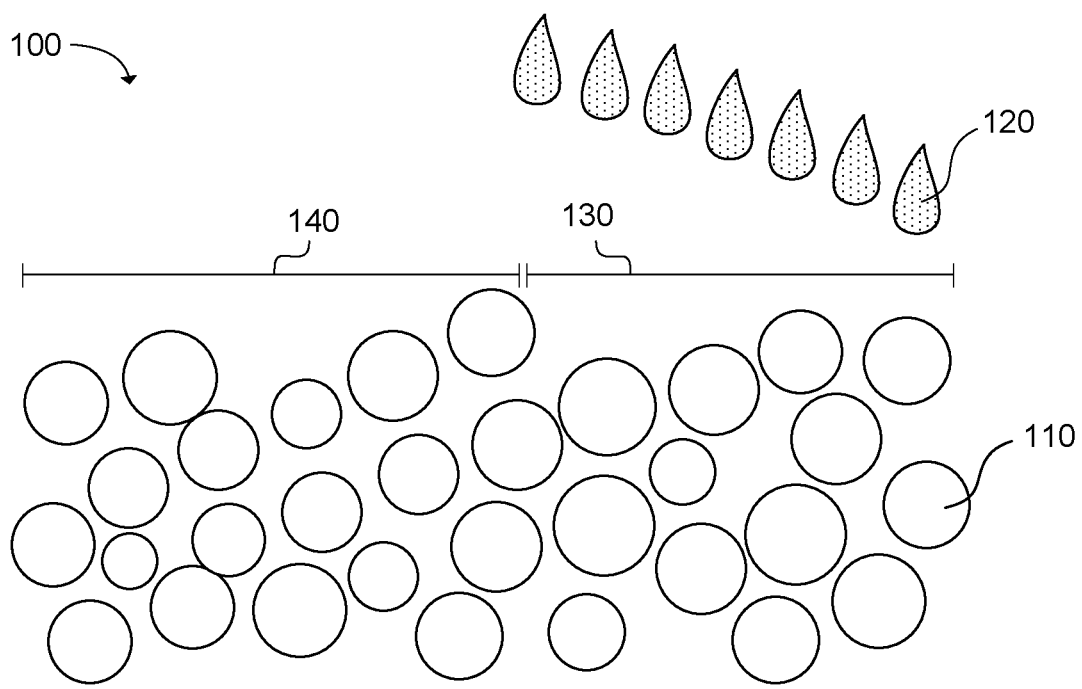
FIG. 1 is a close-up side cross-sectional view of a layer of thermoplastic polymer powder and a pretreat composition in accordance with examples of the present disclosure.

The figure depicts one example of the presently disclosed technology. However, it is understood that the present technology is not limited to the example depicted.

DETAILED DESCRIPTION

The present disclosure is drawn to the area of 3-dimensional printing. More specifically, the present disclosure provides fluid sets, material sets, and systems for printing 3-dimensional parts with electrically conductive features. In an exemplary printing process, a thin layer of thermoplastic polymer powder is spread on a bed to form a powder bed. A printing head, such as an inkjet print head, is then used to print a fusing agent composition over portions of the powder bed corresponding to a thin layer of the three dimensional object to be formed. Then the bed is exposed to a light source, e.g., typically the entire bed. The fusing agent absorbs more energy from the light than the unprinted powder. The absorbed light energy is converted to thermal energy, causing the printed portions of the powder to melt and coalesce. This forms a solid layer. After the first layer is formed, a new thin layer of polymer powder is spread over the powder bed and the process is repeated to form additional layers until a complete 3-dimensional part is printed. Such 3-dimensional printing processes can achieve fast throughput with good accuracy.

In some examples of the presently disclosed technology, an electrically conductive fusing agent composition can be printed on a portion of the powder bed to form electrically conductive features in the 3-dimensional printed part. One example of such a fusing agent composition includes a dispersion of silver metal nanoparticles. Some silver metal inks have been printed on specialty print media having a coating that gives the media a smooth surface and also includes chemical components to aid in creating conductive printed elements. In the context of the 3-dimensional printing processes of the present disclosure, however, such inks can be printed onto a powder bed that has a very rough surface and does not include the chemical components present in such specialty media. Therefore, when conductive inks alone are printed onto the powder bed as a part of the 3-dimensional printing process, the resulting part can sometimes lack electrical conductivity.

Accordingly, the present technology provides a pretreat composition that can be applied to the powder bed before the conductive fusing agent composition. The pretreat composition can include a salt of an alkali metal with bromide or iodide. In some cases, the salt in the pretreat composition can be effective to activate transition metal particles in the conductive fusing agent composition. As used herein, "activate transition metal particles" means converting the transition metal particles to a more active state so that the particles more readily sinter together. For example, activated transition metal particles can sinter together at a lower temperature than would be required to sinter the transition metal particles when the particles are dispersed in the conductive fusing agent composition. In one example, the salt can remove dispersing agents from the surfaces of the transition metal. This can allow the transition metal particles to sinter together at a lower temperature, such as at room temperature, forming a conductive structure. In some examples, the pretreat composition can be jetted on portions of the powder bed, followed by the conductive fusing agent composition to form a conductive portion, and another fusing agent composition can be jetted on other portions of the powder bed to form insulating portions of the final printed part. The materials, systems, and methods described herein can be used to print parts having a wide variety of electrical configurations, such as embedded electrical elements and surface electrical elements. The present technology can also make it possible to form electrical elements enabled by 3-dimensional printing that are not possible using standard electronics manufacturing techniques, such as embedded coils, diagonal vias, and so on.

In some examples of the present disclosure, a fluid set can include a pretreat composition including a salt of an alkali metal with bromide or iodide and a conductive fusing agent composition including a transition metal for fusing thermoplastic powder when exposed to electromagnetic radiation. In further examples, a fluid set can also include a second fusing agent composition including an energy absorber capable of absorbing electromagnetic radiation to produce heat.

The salt used in the pretreat composition can be a salt of an alkali metal with bromide or iodide. In certain examples, the salt can be a salt of lithium, potassium, or sodium with bromide or iodide. These salts may differ in their effectiveness for activating the transition metal particles in the conductive fusing agent composition. The most effective salts can allow the transition metal particles to more fully sinter together. Thus, a 3-dimensional printed conductive feature with higher electrical conductivity can be made. Less effective salts can produce limited sintering of the transition metal particles such that the final 3-dimensional printed feature has some electrical conductivity, but a higher resistance. In certain examples, potassium bromide or sodium bromide may be used to form conductive features with maximal electrical conductivity. Lithium bromide, lithium iodide, potassium iodide, or sodium iodide can be used to form conductive features with higher resistance values. In some cases this may be desirable, such as in applications involving 3-dimensional printed resistors.

In certain examples, the salt of alkali metal with bromide or iodide in the pretreat composition can be in the form of an aqueous solution. In a particular example, the pretreat composition can consist essentially of water and the salt. For example, the pretreat composition can be a solution of potassium bromide in water, a solution of sodium bromide in water, or a solution of both potassium bromide and sodium bromide in water. Aqueous solutions of other salts of alkali metals with bromide or iodide can also be used. For example, aqueous solutions of lithium bromide, lithium iodide, potassium iodide, sodium iodide, or combinations thereof can be used. In further embodiments, the pretreat composition can include other components besides water and the salt. For example, the pretreat composition can include an ink vehicle and other ink additives as explained in more detail below.

The salt of alkali metal with bromide or iodide can be present in the pretreat composition at a concentration that is effective to aid in forming conductive features using the conductive fusing agent composition. In one example, the concentration of salt in the pretreat composition can be from 0.1 wt % to 15 wt %. In another example, the concentration can be from 0.5 wt % to 10 wt %. In yet another example, the concentration can be from 1 wt % to 5 wt %. In certain examples, the pretreat composition can consist essentially of water and the salt in any of the above listed concentrations.

The salt of alkali metal with bromide or iodide can react with dispersing agents at the surfaces of transition metal particles to remove the dispersing agents from the particles. This can increase the sintering between the metal particles and improve the conductivity of the matrix formed of the sintered particles. The pretreat composition can be dispensed onto the powder bed before the conductive fusing agent composition. When the conductive fusing agent composition is printed over the pretreat composition, the transition metal particles can come into contact with the salt in the pretreat composition. In alternate examples, the polymer powder can be pretreated with a salt of n alkali metal with bromide or iodide before being used in the 3-dimensional printing system. When the conductive fusing agent composition is printed onto the thermoplastic polymer powder bed, the transition metal particles in the conductive fusing agent composition can come into contact with the salt of alkali metal with bromide or iodide already present on the powder.

The fluid set can also include a conductive fusing agent composition. The conductive fusing agent composition can include a transition metal. When the conductive fusing agent composition is printed onto a layer of the thermoplastic polymer powder, the conductive fusing agent composition can penetrate into the spaces between powder particles. The layer can then be cured by exposing the layer to electromagnetic radiation. The conductive fusing agent in the composition can facilitate fusing of the powder particles by absorbing energy from the electromagnetic radiation and converting the energy to heat. This raises the temperature of the powder above the melting or softening point of the thermoplastic polymer. Additionally, during printing, curing, or both, the transition metal in the conductive fusing agent composition can form a conductive transition metal matrix that becomes interlocked with the fused thermoplastic polymer particles.

In some examples, the transition metal in the conductive fusing agent composition can be in the form of elemental transition metal particles. The elemental transition metal particles can include, for example, silver particles, copper particles, gold particles, platinum particles, palladium particles, chromium particles, nickel particles, zinc particles, or combinations thereof. The particles can also include alloys of more than one transition metal, such as Au—Ag, Ag—Cu, Ag—Ni, Au—Cu, Au—Ni, Au—Ag—Cu, or Au—Ag—Pd.

In certain examples, other non-transition metals can be included in addition to the transition metal. The non-transition metals can include lead, tin, bismuth, indium, gallium, and others. In some examples, soldering alloys can be included. The soldering alloys can include alloys of lead, tin, bismuth, indium, zinc, gallium, silver, copper, in various combinations. In certain examples, such soldering alloys can be printed in locations that are to be used as soldering connections for printed electrical components. The soldering alloys can be formulated to have low melting temperatures useful for soldering, such as less than 230° C.

In certain examples, the elemental transition metal particles can be nanoparticles having an average particle size from 10 nm to 200 nm. In more specific examples, the elemental transition metal particles can have an average particle size from 30 nm to 70 nm.

As metal particles are reduced in size, the temperature at which the particles are capable of being sintered can also be reduced. Therefore, using elemental transition metal nanoparticles in the conductive fusing agent composition can allow the particles to sinter and form a conductive matrix of sintered nanoparticles at relatively low temperatures. For example, the elemental transition metal particles in the conductive fusing agent composition can be capable of being sintered at or below the temperature reached during curing in the 3-dimensional printing process. The particular temperatures used in the process can vary depending on the melt or fusing temperature of the particular polymer powder used. In a further example, the thermoplastic polymer powder bed can be heated to a preheat temperature during the printing process, and the elemental transition metal particles can be capable of being sintered at or below the preheat temperature. In still further examples, the elemental transition metal particles can be capable of being sintered at a temperature from 20° C. to 350° C. As used herein, the temperature at which the elemental transition metal particles are capable of being sintered refers to the lowest temperature at which the particles will become sintered together, forming a conductive matrix of sintered particles. It is understood that temperatures above this lowest temperature will also cause the particles to become sintered.

In additional examples of the conductive fusing agent composition, the transition metal can be in the form of elemental transition metal particles that are stabilized by a dispersing agent at surfaces of the particles. The dispersing agent can include ligands that passivate the surface of the particles. Suitable ligands can include a moiety that binds to the transition metal. Examples of such moieties can include sulfonic acid, phosphonic acid, carboxylic acid, dithiocarboxylic acid, phosphonate, sulfonate, thiol, carboxylate, dithiocarboxylate, amine, and others. In some cases, the dispersing agent can contain an alkyl group having from 3-20 carbon atoms, with one of the above moieties at an end of the alkyl chain. In certain examples, the dispersing agent can be an alkylamine, alkylthiol, or combinations thereof. In further examples, the dispersing agent can be a polymeric dispersing agent, such as polyvinylpyrrolidone (PVP), polyvinylalcohol (PVA), polymethylvinylether, poly(acrylic acid) (PAA), nonionic surfactants, polymeric chelating agents, and others. The dispersing agent can bind to the surfaces of the elemental transition metal particles through chemical and/or physical attachment. Chemical bonding can include a covalent bond, hydrogen bond, coordination complex bond, ionic bond, or combinations thereof. Physical attachment can include attachment through van der Waal's forces, dipole-dipole interactions, or a combination thereof.

In a particular example, the conductive fusing agent composition can be a silver ink that includes silver nanoparticles dispersed by a dispersing agent. Examples of commercially available silver inks that can be used in the present fluid sets include Mitsubishi® NBSIJ-MU01 available from Mitsubishi Paper Mills Limited, Methode®9101 available from Methode Electronics, Inc., Methode®9102 available from Methode Electronics, Inc., NovaCentrix™ JS-B40G available from NovaCentrix, and others.

In further examples, the conductive fusing agent composition can include a transition metal in the form of a metal salt or metal oxide. Under certain conditions, a transition metal salt or metal oxide in the conductive fusing agent composition can form elemental transition metal particles in situ after being printed onto the thermoplastic polymer powder bed. The elemental transition metal particles thus formed can then be sintered together to form a conductive matrix. In some examples, a reducing agent can be reacted with the metal salt or metal oxide to produce elemental metal particles. In one example, a reducing agent can be underprinted onto the powder bed before the conductive fusing agent composition. In another example, a reducing agent can be overprinted over the conductive fusing agent composition. In either case, the reducing agent can be reacted with the metal salt or metal oxide to form elemental metal particles before the thermoplastic polymer particle layer is cured. Suitable reducing agents can include, for example, glucose, fructose, maltose, maltodextrin, trisodium citrate, ascorbic acid, sodium borohydride, ethylene glycol, 1,5-pentanediol, 1,2-propylene glycol, and others.

The concentration of transition metal in the conductive fusing agent composition can vary. However, higher transition metal concentrations can tend to provide better conductivity due to a larger amount of conductive material being deposited on the powder bed. In some examples, the conductive fusing agent composition can contain from about 5 wt % to about 50 wt % of the transition metal, with respect to the entire weight of the conductive fusing agent composition. In further examples, the conductive fusing agent composition can contain from about 10 wt % to about 30 wt % of the transition metal, with respect to the entire weight of the conductive fusing agent composition.

Other variables in the 3-dimensional printing process can also be adjusted to change the amount of transition metal deposited on the powder bed. In several examples, the conductive fusing agent composition can be printed from a greater number of slots in an ink jet printer to increase the amount of the transition metal deposited onto the powder bed. Printing multiple passes with the conductive fusing agent composition can also be used to increase the amount of transition metal deposited onto the powder bed. Additionally, using a higher drop weight in an ink jet printer can increase the amount of transition metal deposited onto the powder bed.

Fluid sets in accordance with the present technology can also include a second fusing agent composition. In some examples, the second fusing agent composition can be devoid or substantially devoid of the transition metal contained in the conductive fusing agent composition. Thus, the second fusing agent composition can provide a lower conductivity than the conductive fusing agent composition when printed on the thermoplastic polymer powder. However, in some examples the second fusing agent composition can include metal particles that provide a lower conductivity than the transition metal in the conductive fusing agent composition. For example, the second fusing agent composition can include metal particles with passivated surfaces that do not sinter together to form a conductive matrix.

The second fusing agent composition can contain another energy absorber that is capable of absorbing electromagnetic radiation to produce heat. The energy absorber can be colored or colorless. In various examples, the energy absorber can be carbon black, near-infrared absorbing dyes, near-infrared absorbing pigments, tungsten bronzes, molybdenum bronzes, metal nanoparticles, a conjugated polymer, or combinations thereof. Examples of near-infrared absorbing dyes include aminium dyes, tetraaryldiamine dyes, cyanine dyes, pthalocyanine dyes, dithiolene dyes, and others. In further examples, the energy absorber can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the energy absorber can have a peak absorption wavelength in the range of 800 nm to 1400 nm.

The amount of energy absorber in the second fusing agent composition can vary depending on the type of energy absorber. In some examples, the concentration of energy absorber in the second fusing agent composition can be from 0.1 wt % to 20 wt %. In one example, the concentration of energy absorber in the second fusing agent composition can be from 0.1 wt % to 15 wt %. In another example, the concentration can be from 0.1 wt % to 8 wt %. In yet another example, the concentration can be from 0.5 wt % to 2 wt %. In a particular example, the concentration can be from 0.5 wt % to 1.2 wt %.

In some examples, the fusing agent composition can have a black or gray color due to the use of carbon black as the energy absorber. However, in other examples the fusing agent composition can be colorless or nearly colorless. The concentration of the energy absorber can be adjusted to provide a fusing agent composition in which the visible color of the fusing agent composition is not substantially altered by the energy absorber. Although some of the above described energy absorbers have low absorbance in the visible light range, the absorbance is usually greater than zero. Therefore, the energy absorbers can typically absorb some visible light, but their color in the visible spectrum can be minimal enough that it does not substantially impact the fusing agent composition's ability to take on another color when a colorant is added (unlike carbon black which dominates the ink's color with gray or black tones). The energy absorbers in concentrated form can have a visible color, but the concentration of the energy absorbers in the fusing agent composition can be adjusted so that the energy absorbers are not present in such high amounts that they alter the visible color of the fusing agent composition. For example, an energy absorber with a very low absorbance of visible light wavelengths can be included in greater concentrations compared to an energy absorber with a relatively higher absorbance of visible light. These concentrations can be adjusted based on a specific application with some experimentation.

In further examples, the concentration of the energy absorber can be high enough that the energy absorber impacts the color of the fusing agent composition, but low enough that when the fusing agent composition is printed on the thermoplastic polymer powder, the energy absorber does not impact the color of the powder. In one example, the energy absorber can have a concentration in the fusing agent composition such that after the fusing agent composition is printed onto the polymer powder, the amount of energy absorber in the polymer powder is from 0.0003 wt % to 5 wt % with respect to the weight of the polymer powder.

The energy absorber can have a temperature boosting capacity sufficient to increase the temperature of the polymer powder above the melting or softening point of the polymer powder. As used herein, "temperature boosting capacity" refers to the ability of an energy absorber to convert near-infrared light energy into thermal energy to increase the temperature of the printed polymer powder over and above the temperature of the unprinted portion of the polymer powder. Typically, the polymer powder particles can be fused together when the temperature increases to the melting or softening temperature of the polymer. As used herein, "melting point" refers to the temperature at which a polymer transitions from a crystalline phase to a pliable, amorphous phase. Some polymers do not have a melting point, but rather have a range of temperatures over which the polymers soften. This range can be segregated into a lower softening range, a middle softening range and an upper softening range. In the lower and middle softening ranges, the particles can coalesce to form a part while the remaining polymer powder remains loose. If the upper softening range is used, the whole powder bed can become a cake. The "softening point," as used herein, refers to the temperature at which the polymer particles coalesce while the remaining powder remains separate and loose. When the fusing agent composition is printed on a portion of the polymer powder, the energy absorber can heat the printed portion to a temperature at or above the melting or softening point, while the unprinted portions of the polymer powder remain below the melting or softening point. This allows the formation of a solid 3D printed part, while the loose powder can be easily separated from the finished printed part.

Although melting point and softening point are often described herein as the temperatures for coalescing the polymer powder, in some cases the polymer particles can coalesce together at temperatures slightly below the melting point or softening point. Therefore, as used herein "melting point" and "softening point" can include temperatures slightly lower, such as up to about 20° C. lower, than the actual melting point or softening point.

In one example, the energy absorber can have a temperature boosting capacity from about 10° C. to about 70° C. for a polymer with a melting or softening point from about 100° C. to about 350° C. If the powder bed is at a temperature within about 10° C. to about 70° C. of the melting or softening point, then such an energy absorber can boost the temperature of the printed powder up to the melting or softening point, while the unprinted powder remains at a lower temperature. In some examples, the powder bed can be preheated to a temperature from about 10° C. to about 70° C. lower than the melting or softening point of the polymer. The fusing agent composition can then be printed onto the powder and the powder bed can be irradiated with a near-infrared light to coalesce the printed portion of the powder.

In some examples of the fluid sets according to the present technology, the conductive fusing agent composition and the second fusing agent composition can be balanced so that thermoplastic polymer powder that is printed with the conductive fusing agent composition and the second fusing agent composition reach nearly the same temperature when exposed to light during curing. The type and amount of energy absorber in the second fusing agent composition can be selected to match the temperature boosting capacity of the transition metal in the conductive fusing agent composition. The type and amount of transition metal in the conductive fusing agent composition can also be adjusted to match the temperature boosting capacity of the energy absorber in the second fusing agent composition. Additionally, in some examples the conductive fusing agent composition can contain another energy absorber other than the transition metal. In certain examples, the conductive fusing agent composition and the second fusing agent composition can raise the temperature of the thermoplastic polymer powder to temperatures within 30° C., within 20° C., or within 10° C. of each other during curing.

In further examples, the fluid set can also include colored inks for adding color to the thermoplastic polymer powder. This can allow for printing of full-color 3-dimensional parts. In one example, the fluid set can include cyan, magenta, yellow, and black inks in addition to the conductive fusing agent composition, second fusing agent composition, and pretreat ink if present.

Each of the conductive fusing agent compositions, pretreat composition, second fusing agent composition, and additional colored inks can be formulated for use in an ink jet printer. The transition metal and energy absorbers can be stable in a fluid jettable vehicle and the fluids can provide good jetting performance. In some examples, the transition metal and energy absorbers can be water-soluble, water-dispersible, organic-soluble, or organic-dispersible. The transition metal and energy absorbers can also be compatible with the thermoplastic polymer powder so that jetting the fluids onto the polymer powder provides adequate coverage and penetration of the transition metal and energy absorbers into the powder.

Any of the above described fluids can also include a pigment or dye colorant that imparts a visible color to the fluids. In some examples, the colorant can be present in an amount from 0.5 wt % to 10 wt % in the fluids. In one example, the colorant can be present in an amount from 1 wt % to 5 wt %. In another example, the colorant can be present in an amount from 5 wt % to 10 wt %. However, the colorant is optional and in some examples the fluids can include no additional colorant. These fluids can be used to print 3D parts that retain the natural color of the polymer powder. Additionally, the fluids can include a white pigment such as titanium dioxide that can also impart a white color to the final printed part. Other inorganic pigments such as alumina or zinc oxide can also be used.

In some examples, the colorant can be a dye. The dye may be nonionic, cationic, anionic, or a mixture of nonionic, cationic, and/or anionic dyes. Specific examples of dyes that may be used include, but are not limited to, Sulforhodamine B, Acid Blue 113, Acid Blue 29, Acid Red 4, Rose Bengal, Acid Yellow 17, Acid Yellow 29, Acid Yellow 42, Acridine Yellow G, Acid Yellow 23, Acid Blue 9, Nitro Blue Tetrazolium Chloride Monohydrate or Nitro BT, Rhodamine 6G, Rhodamine 123, Rhodamine B, Rhodamine B Isocyanate, Safranine O, Azure B, and Azure B Eosinate, which are available from Sigma-Aldrich Chemical Company (St. Louis, Mo.). Examples of anionic, water-soluble dyes include, but are not limited to, Direct Yellow 132, Direct Blue 199, Magenta 377 (available from Ilford AG, Switzerland), alone or together with Acid Red 52. Examples of water-insoluble dyes include azo, xanthene, methine, polymethine, and anthraquinone dyes. Specific examples of water-insoluble dyes include Orasol® Blue GN, Orasol® Pink, and Orasol® Yellow dyes available from Ciba-Geigy Corp. Black dyes may include, but are not limited to, Direct Black 154, Direct Black 168, Fast Black 2, Direct Black 171, Direct Black 19, Acid Black 1, Acid Black 191, Mobay Black SP, and Acid Black 2.

In other examples, the colorant can be a pigment. The pigment can be self-dispersed with a polymer, oligomer, or small molecule, or can be dispersed with a separate dispersant. Suitable pigments include, but are not limited to, the following pigments available from BASF: Paliogen®) Orange, Heliogen® Blue L 6901F, Heliogen®) Blue NBD 7010, Heliogen® Blue K 7090, Heliogen® Blue L 7101F, Paliogen®) Blue L 6470, Heliogen®) Green K 8683, and Heliogen® Green L 9140. The following black pigments are available from Cabot: Monarch®1400, Monarch® 1300, Monarch®) 1100, Monarch® 1000, Monarch®) 900, Monarch®880, Monarch®800, and Monarch®) 700. The following pigments are available from CIBA: Chromophtal®) Yellow 3G, Chromophtal®) Yellow GR, Chromophtal®) Yellow 8G, Igrazin® Yellow 5GT, Igralite® Rubine 4BL, Monastral® Magenta, Monastral® Scarlet, Monastral® Violet R, Monastral® Red B, and Monastral® Violet Maroon B. The following pigments are available from Degussa: Printex® U, Printex® V, Printex® 140U, Printex® 140V, Color Black FW 200, Color Black FW 2, Color Black FW 2V, Color Black FW 1, Color Black FW 18, Color Black S 160, Color Black S 170, Special Black 6, Special Black 5, Special Black 4A, and Special Black 4. The following pigment is available from DuPont: Tipure®) R-101. The following pigments are available from Heubach: Dalamar® Yellow YT-858-D and Heucophthal Blue G XBT-583D. The following pigments are available from Clariant: Permanent Yellow GR, Permanent Yellow G, Permanent Yellow DHG, Permanent Yellow NCG-71, Permanent Yellow GG, Hansa Yellow RA, Hansa Brilliant Yellow 5GX-02, Hansa Yellow-X, Novoperm® Yellow HR, Novoperm® Yellow FGL, Hansa Brilliant Yellow 10GX, Permanent Yellow G3R-01, Hostaperm® Yellow H4G, Hostaperm® Yellow H3G, Hostaperm® Orange GR, Hostaperm® Scarlet GO, and Permanent Rubine F6B. The following pigments are available from Mobay: Quindo® Magenta, Indofast® Brilliant Scarlet, Quindo® Red R6700, Quindo® Red R6713, and Indofast® Violet. The following pigments are available from Sun Chemical: L74-1357 Yellow, L75-1331 Yellow, and L75-2577 Yellow. The following pigments are available from Columbian: Raven® 7000, Raven® 5750, Raven® 5250, Raven® 5000, and Raven® 3500. The following pigment is available from Sun Chemical: LHD9303 Black. Any other pigment and/or dye can be used that is useful in modifying the color of the above described inks and/or ultimately, the printed part.

The colorant can be included in the conductive fusing agent composition and/or the second fusing agent composition to impart color to the printed object when the fusing agent compositions are jetted onto the powder bed. Optionally, a set of differently colored fusing agent compositions can be used to print multiple colors. For example, a set of fusing agent compositions including any combination of cyan, magenta, yellow (and/or any other colors), colorless, white, and/or black fusing agent compositions can be used to print objects in full color. Alternatively or additionally, a colorless fusing agent composition can be used in conjunction with a set of colored, non-fusing agents to impart color. In some examples, a colorless fusing agent composition can be used to coalesce the polymer powder and a separate set of colored or black or white inks not containing an energy absorber can be used to impart color.

The components of the above described pretreat compositions and fusing agent compositions can be selected to give the fluids good jetting performance and optionally the ability to color the polymer powder with good optical density. Besides the salts of alkali metal and bromide or iodide, transition metals, energy absorbers, colorants and other ingredients described above, the fluids described above can also include a liquid vehicle. In some examples, the liquid vehicle formulation can include water and one or more co-solvents present in total at from 1 wt % to 50 wt %, depending on the jetting architecture. Further, one or more non-ionic, cationic, and/or anionic surfactant can optionally be present, ranging from 0.01 wt % to 20 wt %. In one example, the surfactant can be present in an amount from 5 wt % to 20 wt %. The liquid vehicle can also include dispersants in an amount from 5 wt % to 20 wt %. The balance of the formulation can be purified water, or other vehicle components such as biocides, viscosity modifiers, materials for pH adjustment, sequestering agents, preservatives, and the like. In one example, the liquid vehicle can be predominantly water. In some examples, a water-dispersible or water-soluble energy absorber can be used with an aqueous vehicle. Because the energy absorber is dispersible or soluble in water, an organic co-solvent is not necessary to solubilize the energy absorber. Therefore, in some examples the fluids can be substantially free of organic solvent. However, in other examples a co-solvent can be used to help disperse other dyes or pigments, improve the jetting properties of the fluids, or aid in penetration of fluid into the powder bed. In still further examples, a non-aqueous vehicle can be used with an organic-soluble or organic-dispersible energy absorber.

In certain examples, a high boiling point co-solvent can be included in the fluids. The high boiling point co-solvent can be an organic co-solvent that boils at a temperature higher than the temperature of the powder bed during printing. In some examples, the high boiling point co-solvent can have a boiling point above 250° C. In still further examples, the high boiling point co-solvent can be present in the fluids at a concentration from about 1 wt % to about 4 wt %.

Classes of co-solvents that can be used can include organic co-solvents including aliphatic alcohols, aromatic alcohols, diols, glycol ethers, polyglycol ethers, caprolactams, formamides, acetamides, and long chain alcohols. Examples of such compounds include primary aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include, but are not limited to, 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanediol.

One or more surfactants can also be used, such as alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. The amount of surfactant added to the formulation of this disclosure may range from 0.01 wt % to 20 wt %. Suitable surfactants can include, but are not limited to, liponic esters such as Tergitol™ 15-S-12, Tergitol™ 15-S-7 available from Dow Chemical Company, LEG-1 and LEG-7; Triton™ X-100; Triton™ X-405 available from Dow Chemical Company; and sodium dodecylsulfate.

Consistent with the formulation of this disclosure, various other additives can be employed to optimize the properties of the pretreat compositions and/or fusing agent compositions for specific applications. Examples of these additives are those added to inhibit the growth of harmful microorganisms. These additives may be biocides, fungicides, and other microbial agents, which are routinely used in ink formulations. Examples of suitable microbial agents include, but are not limited to, Nuosept® (Nudex, Inc.), Ucarcide™ (Union carbide Corp.), Vancide® (R.T. Vanderbilt Co.), Proxel® (ICI America), and combinations thereof.

Sequestering agents, such as EDTA (ethylene diamine tetra acetic acid), may be included to eliminate the deleterious effects of heavy metal impurities, and buffer solutions may be used to control the pH of the fluids. From 0.01 wt % to 2 wt %, for example, can be used. Viscosity modifiers and buffers may also be present, as well as other additives to modify properties of the fluids as desired. Such additives can be present at from 0.01 wt % to 20 wt %.

The present technology also extends to material sets that include fluids such as in the fluid sets described above. In some examples of the present disclosure, a material set, such as for 3-dimensional printing, can include a thermoplastic polymer powder having an average particle size from 20 µm to 100 µm, a pretreat composition including a salt of an alkali metal with bromide or iodide, and a conductive fusing agent composition including a transition metal. As used herein, "average" with respect to properties of particles refers to a number average unless otherwise specified. Accordingly, "average particle size" refers to a number average particle size. Additionally, "particle size" refers to the diameter of spherical particles, or to the longest dimension of non-spherical particles.

In certain examples, the polymer particles can have a variety of shapes, such as substantially spherical particles or irregularly-shaped particles. In some examples, the polymer powder can be capable of being formed into 3D printed parts with a resolution of 20 to 100 microns. As used herein, "resolution" refers to the size of the smallest feature that can be formed on a 3D printed part. The polymer powder can form layers from about 20 to about 100 microns thick, allowing the fused layers of the printed part to have roughly the same thickness. This can provide a resolution in the z-axis direction of about 20 to about 100 microns. The polymer powder can also have a sufficiently small particle size and sufficiently regular particle shape to provide about 20 to about 100 micron resolution along the x-axis and y-axis.

In some examples, the thermoplastic polymer powder can be colorless. For example, the polymer powder can have a white, translucent, or transparent appearance. When used with a colorless fusing agent composition, such polymer powders can provide a printed part that is white, translucent, or transparent. In other examples, the polymer powder can be colored for producing colored parts. In still other examples, when the polymer powder is white, translucent, or transparent, color can be imparted to the part by the fusing agent composition or another colored ink.

The thermoplastic polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be selected from the group consisting of nylon 6 powder, nylon 9 powder, nylon 11 powder, nylon 12 powder, nylon 66 powder, nylon 612 powder, polyethylene powder, thermoplastic polyurethane powder, polypropylene powder, polyester powder, polycarbonate powder, polyether ketone powder, polyacrylate powder, polystyrene powder, and mixtures thereof. In a specific example, the polymer powder can be nylon 12, which can have a melting point from about 175° C. to about 200° C. In another specific example, the polymer powder can be thermoplastic polyurethane.

The thermoplastic polymer particles can also in some cases be blended with a filler. The filler can include inorganic particles such as alumina, silica, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from 10:1 to 1:2 or from 5:1 to 1:1.

The material set can also include the fluids as in the fluid sets described above. For example, the material set can include a pretreat composition, conductive fusing agent composition, and another fusing agent composition as described above. Additional colored inks can also be included in some examples. These fluids can have any of the ingredients and properties described above. Additionally, the thermoplastic polymer particles of the material set can have any of the properties described above with respect to thermoplastic polymer powder for printing with the fluids.

One example illustrating the use of a fluid set and material set according to the present technology is shown in FIGS. 1-4. FIG. 1 shows a layer 100 of thermoplastic polymer powder particles 110. A pretreat composition 120 is dispensed onto a first portion 130 of the layer. A second portion 140 of the layer is not printed with the pretreat composition.

Figure 2:
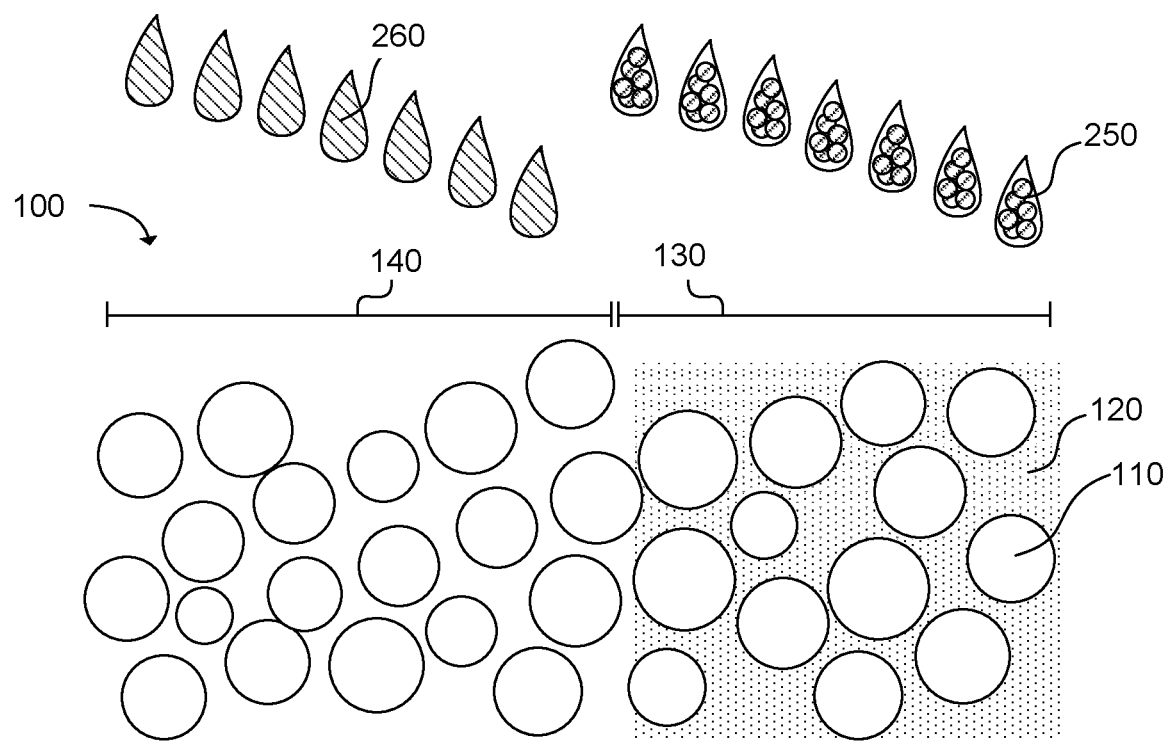
FIG. 2 is a close-up side cross-sectional view of a layer of thermoplastic polymer powder, a conductive fusing agent composition, and a second fusing agent composition in accordance with examples of the present disclosure.

FIG. 2 shows the layer 100 of thermoplastic polymer powder particles 110 being printed with a conductive fusing agent composition 250 in the first portion 130 of the layer, and a second fusing agent composition 260 in the second portion 140 of the layer. The conductive fusing agent composition can be printed over the pretreat composition 120. In some examples, a salt of alkali metal with bromide or iodide from the pretreat composition can react with dispersing agents on the surfaces of transition metal particles in the conductive fusing agent composition to remove the dispersing agents.

Figure 3:
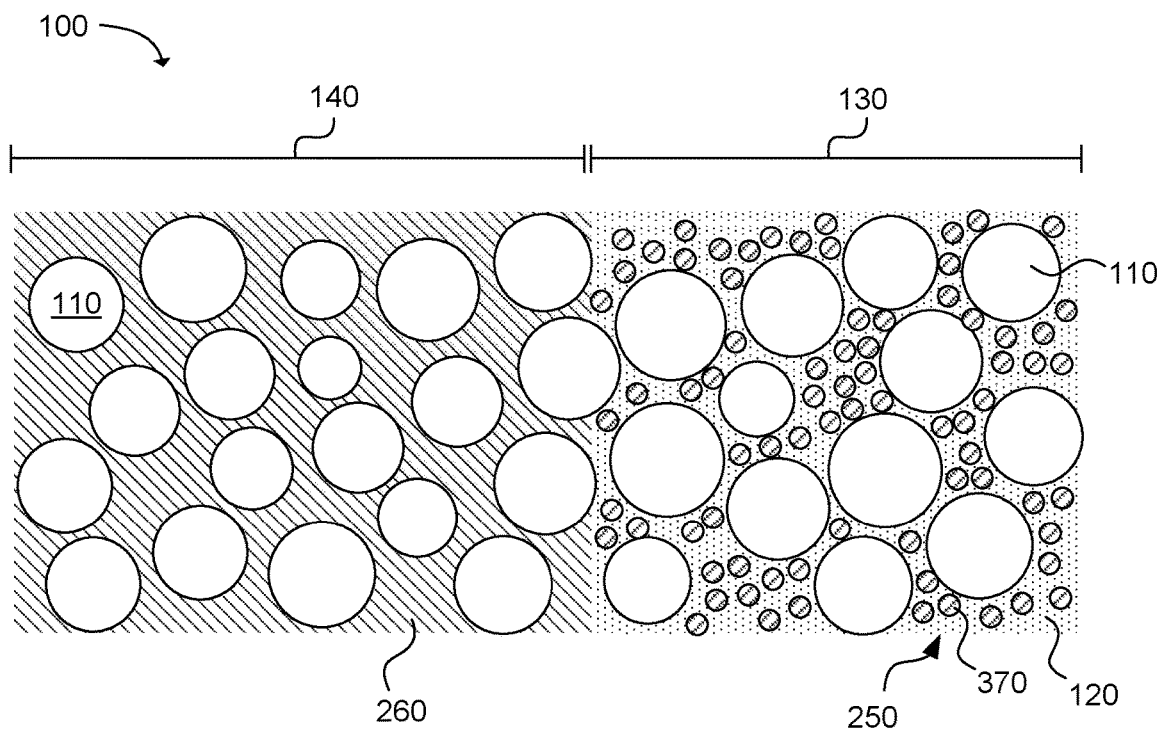
FIG. 3 is a close-up side cross-sectional view of a layer of thermoplastic polymer powder and transition metal particles in a portion of the layer in accordance with examples of the present disclosure.

FIG. 3 shows the layer 100 of thermoplastic polymer powder particles 110 after the pretreat composition 120, conductive fusing agent composition (shown generally at 250), and second fusing agent composition 260 have been printed onto the layer. The transition metal particles 370 from the conductive fusing agent composition occupy spaces between the powder particles in the first portion 130. The second portion 140 includes an energy absorber from the second fusing agent composition. It is noted that these figures are not necessarily drawn to scale, and the relative sizes of powder particles and transition metal particles can differ from those shown. For example, in many cases the transition metal particles can be much smaller than the powder particles, such as 2-3 orders of magnitude smaller.

Figure 4:
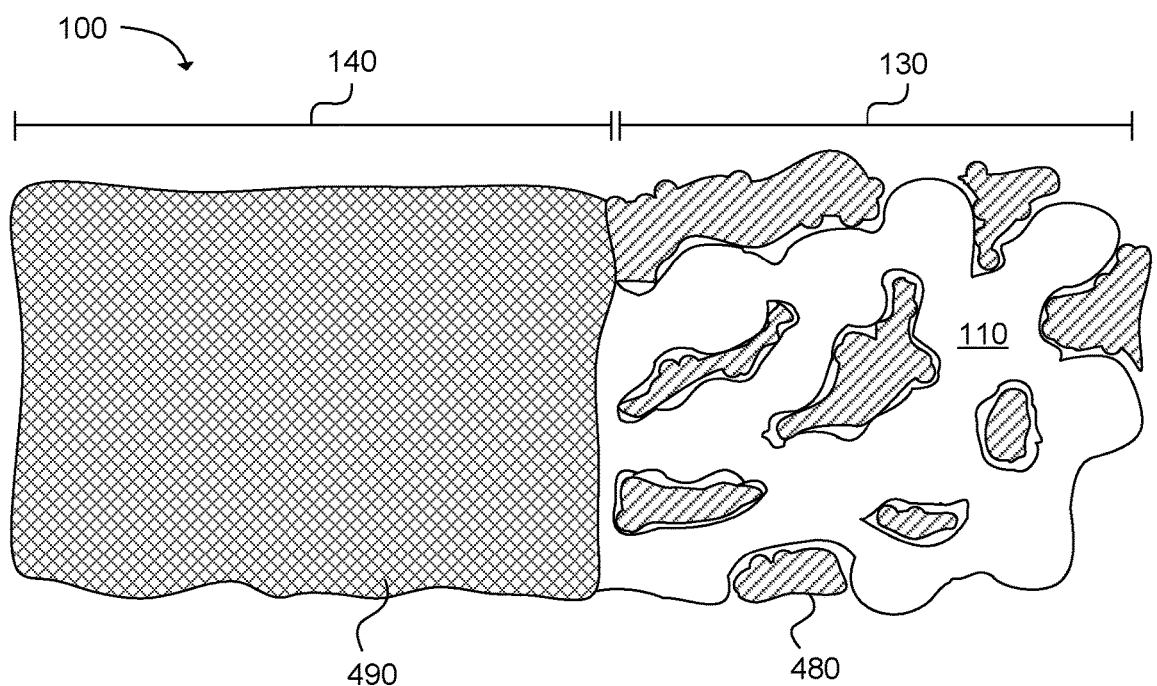
FIG. 4 is a close-up side cross-sectional view of a layer of thermoplastic polymer powder with transition metal particles in a portion of the layer that has been cured to form a matrix of fused thermoplastic polymer particles interlocked with a matrix of sintered transition metal particles in accordance with examples of the present disclosure.

FIG. 4 shows the layer 100 after being cured. When the powder layer is cured by exposure to electromagnetic radiation, the transition metal particles in the first portion 130 sinter together to form a matrix of sintered metal particles 480. The thermoplastic polymer particles 110 fuse together in the second portion 140, forming a matrix of fused thermoplastic polymer particles 490. The matrix of sintered metal particles and the fused thermoplastic polymer particles in the first portion are interlocked, forming the conductive composite. It is noted that FIGS. 1-4 shows only a 2-dimensional cross-section of the conductive composite. Although the sintered metal particles appear to be in isolated locations in the figure, the matrix of sintered metal particles can be a continuously connected matrix in three dimensions. Thus, the conductive composite can have good electrical conductivity through the matrix of sintered transition metal particles.

Figure 5:
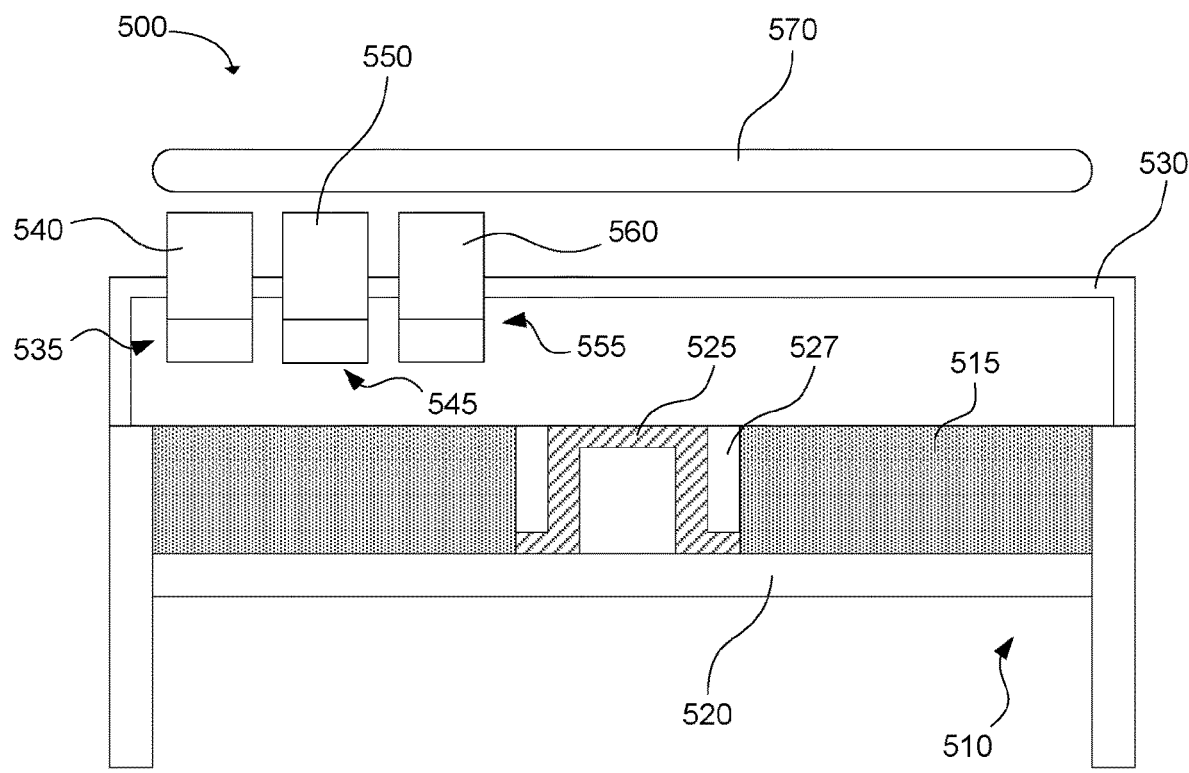
FIG. 5 is a schematic view of a 3-dimensional printing system in accordance with examples of the present disclosure.

In addition to the fluid sets and material sets described above, the present technology also encompasses 3-dimensional printing systems that include the material sets described herein. An example of a 3-dimensional printing system 500 is shown in FIG. 5. The system includes a powder bed 510 including a thermoplastic polymer powder 515 having an average particle size from 20 μm to 100 μm. In the example shown, the powder bed has a moveable floor 520 that allows the powder bed to be lowered after each layer of the 3-dimensional part is printed. The 3-dimensional part can include a conductive portion 525 and an insulating portion 527. The system also includes a fluid jet printer 530 that includes a first fluid jet printing slot 535 in communication with a reservoir of a pretreat composition 540. The first fluid jet printing slot can be configured to print the pretreat composition onto the powder bed. A second fluid jet printing slot 545 is in communication with a reservoir of a conductive fusing agent composition 550. The second fluid jet printing slot can be configured to print the conductive fusing agent composition onto the powder bed. A third fluid jet printing slot 555 can be in communication with a reservoir of a second fusing agent composition 560. The third fluid jet printing slot can be configured to print the second fusing agent composition onto the powder bed. After the fusing agent compositions have been printed onto the powder bed, a fusing lamp 570 can be used to expose the powder bed to electromagnetic radiation sufficient to fuse the powder that has been printed with the fusing agent compositions.

The fluid set and/or material set used in the 3-dimensional printing system can include any of the components and ingredients described above. For example, more generally, the 3-dimensional printing system can include a powder bed, a fluid jet printer, and a fusing energy source to emit electromagnetic radiation sufficient to fuse thermoplastic polymer powder that has been printed with a conductive fusing agent composition from the fluid jet printer. The fluid jet printer can include a first fluid jet printing slot in communication with a reservoir of a pretreat composition to print the pretreat composition onto the powder bed, wherein the pretreat composition includes a salt of an alkali metal with bromide or iodide. The fluid jet printer can also include a second fluid jet printing slot in communication with a reservoir of a conductive fusing agent composition to print the conductive fusing agent composition onto the powder bed, wherein the conductive fusing agent composition includes a transition metal.

In a related example, a method of printing a 3-dimensional part can include applying or printing a pretreat composition to a powder bed which includes a thermoplastic polymer powder. The pretreat composition can include a salt of an alkali metal with bromide or iodide. The method can also include printing a conductive fusing agent composition to onto the powder bed, wherein the conductive fusing agent composition includes a transition metal. An additional step can include emitting electromagnetic radiation toward the thermoplastic polymer powder having the pretreat composition and the conductive fusing agent composition applied thereto sufficient to fuse thermoplastic polymer powder. The electromagnetic radiation, e.g., power level, wavelength, etc., can be selected based on the thermoplastic polymer powder and/or transition metal selected for use. This process can be carried out on a layer by layer basis to form a 3-dimensional printed part.

In a particular example, the conductive fusing agent composition can include elemental transition metal particles that are silver particles, copper particles, gold particles, or combinations thereof. In a further example, the elemental transition metal particles can have an average particle size from 10 nm to 200 nm. In another example, the energy absorber in the second fusing agent composition can include carbon black, a near-infrared absorbing dye, a near-infrared absorbing pigment, a tungsten bronze, a molybdenum bronze, metal nanoparticles, a conjugated polymer, or combinations thereof.

In other specific examples, pretreat composition of the 3-dimensional printing system can include a salt of an alkali metal with bromide or iodide that includes sodium bromide, potassium bromide, or combinations thereof. Furthermore, the transition metal can be in the form of elemental transition metal particles including a dispersing agent at surfaces of the elemental transition metal particles. The dispersing agent can be capable of being removed from the surfaces by contact with the salt.

To achieve good selectivity between the fused and unfused portions of the powder bed, the fusing agent compositions can absorb enough energy to boost the temperature of the thermoplastic polymer powder above the melting or softening point of the polymer, while unprinted portions of the powder bed remain below the melting or softening point. In some examples, the 3-dimensional printing system can include preheaters for preheating the thermoplastic polymer powder to a temperature near the melting or softening point. In one example, the system can include a print bed heater to heat the print bed during printing. The preheat temperature used can depend on the type of thermoplastic polymer used. In some examples, the print bed heater can heat the print bed to a temperature from 130° C. to 160° C. The system can also include a supply bed, where polymer particles are stored before being spread in a layer onto the print bed. The supply bed can have a supply bed heater. In some examples, the supply bed heater can heat the supply bed to a temperature from 90° C. to 140° C.

In some cases, the pretreat composition can be dried after being dispensed onto the powder bed and before dispensing the conductive fusing agent composition over the pretreat composition. However, in examples where the pretreat composition is an aqueous solution and the powder bed is preheated to an elevated temperature, the water in the pretreat composition can evaporate quickly after printing so that no additional drying time is necessary.

Suitable fusing lamps for use in the 3-dimensional printing system can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing agent compositions leaving the unprinted portions of the polymer powder below the melting or softening point.

In one example, the fusing lamp can be matched with the energy absorbers in the fusing agent compositions so that the fusing lamp emits wavelengths of light that match the peak absorption wavelengths of the energy absorbers. An energy absorber with a narrow peak at a particular near-infrared wavelength can be used with a fusing lamp that emits a narrow range of wavelengths at approximately the peak wavelength of the energy absorber. Similarly, an energy absorber that absorbs a broad range of near-infrared wavelengths can be used with a fusing lamp that emits a broad range of wavelengths. Matching the energy absorber and the fusing lamp in this way can increase the efficiency of coalescing the polymer particles with the energy absorber printed thereon, while the unprinted polymer particles do not absorb as much light and remain at a lower temperature.

Depending on the amount of energy absorber present in the polymer powder, the absorbance of the energy absorber, the preheat temperature, and the melting or softening point of the polymer, an appropriate amount of irradiation can be supplied from the fusing lamp. In some examples, the fusing lamp can irradiate each layer from about 0.5 to about 10 seconds per pass.

Other methods of fusing the layers of polymer powder can include using microwave radiation sources, xenon pulse lamps, IR lasers, and other sources of electromagnetic radiation.

After printing a conductive composite feature using the system according to the present technology, the conductive composite can have sufficient electrical conductivity to be used to form electrical components. The resistance of the conductive composite can be tuned in a variety of ways. For example, the resistance can be affected by the type of salt in the pretreat composition, the type of transition metal in the conductive fusing agent composition, the concentration of the transition metal in the conductive fusing agent composition, the amount of pretreat composition dispensed onto the powder bed, the amount of conductive fusing agent composition dispensed onto the powder bed, the cross section and length of the conductive portion of the 3-dimensional printed part, and so on. When the pretreat composition or conductive fusing agent composition is dispensed by inkjetting, the amount of pretreat composition or conductive fusing agent composition dispensed can be adjusted by changing print speed, drop weight, number of slots from which the fluids are fired in the ink jet printer, and number of passes printed per powder layer. In certain examples, a conductive composite element can have a resistance from 1 ohm to 5 Mega ohms.

Sufficient conductivity can be achieved by dispensing a sufficient amount of the transition metal onto the powder bed. In some examples, a sufficient mass of the transition metal per volume of the conductive composite can be used to achieve conductivity. For example, the mass of transition metal per volume of conductive composite can be greater than 1 mg/cm$^3$, greater than 10 mg/cm$^3$, greater than 50 mg/cm$^3$, or greater than 100 mg/cm$^3$. In a particular example, the mass of transition metal per volume of the conductive composite can be greater than 140 mg/cm$^3$. In further examples, the mass of transition metal per volume of conductive composite can be from 1 mg/cm$^3$ to 1000 mg/cm$^3$, from 10 mg/cm$^3$ to 1000 mg/cm$^3$, from 50 mg/cm$^3$ to 500 mg/cm$^3$, or from 100 mg/cm$^3$ to 500 mg/cm$^3$.

Similarly, the amount of pretreat composition dispensed onto the powder bed can affect the conductivity of the printed conductive composite. For example, the mass of the salt of alkali metal with bromide or iodide per volume of conductive composite can be greater than 0.2 mg/cm$^3$, greater than 3 mg/cm$^3$, greater than 10 mg/cm$^3$, or greater than 20 mg/cm$^3$. In a particular example, the mass of the salt per volume of the conductive composite can be greater than 28 mg/cm$^3$. In further examples, the mass of the salt per volume of conductive composite can be from 0.2 mg/cm$^3$ to 200 mg/cm$^3$, from 2 mg/cm$^3$ to 200 mg/cm$^3$, from 10 mg/cm$^3$ to 100 mg/cm$^3$, or from 20 mg/cm$^3$ to 100 mg/cm$^3$.

In some examples, the amount of salt or transition metal dispensed onto the powder bed can be adjusted by printing the pretreat composition or conductive fusing agent composition in multiple passes. In one example, a single pass of a fluid jet printhead can be sufficient to dispense enough salt and/or transition metal to achieve surface conductivity. In further examples, additional passes can be performed to further increase conductivity. In some cases, the amount of salt and transition metal dispensed can be sufficient to provide bulk conductivity throughout the whole volume of the printed conductive composite, and not along the surface of the layer only. In one example, three or more passes can be used to form a conductive composite with bulk conductivity. In further examples, the amount of salt and/or transition metal dispensed can be adjusted by adjusting the drop weight of the fluid jet printhead either through resistor design or by changing firing parameters. Thus, with a greater drop weight, a greater amount of the conductive fusing agent composition can be printed with each drop fired. However, in some cases jetting too large an amount of the conductive fusing agent composition in a single pass can lead to lower print quality because of spreading. Additionally, printing a large amount of liquid onto the powder bed can cause the powder to cool excessively, which can lead to curling, lower density of fused polymer, and delamination of fused layers. Therefore, in some examples multiple passes can be used to print more of the conductive fusing agent composition with better print quality and to provide a higher quality printed part.

In a particular example, a 3-dimensional printed part can be formed as follows. A fluid jet printer can be used to print a first pass including printing a pretreat composition followed by a conductive fusing agent composition onto a first portion of the powder bed and printing a second fusing agent composition onto a second portion of the powder bed. A curing pass can then be performed by passing a fusing lamp over the powder bed to fuse the polymer particles and sinter transition metal particles in the conductive fusing agent composition. Then, one or more additional passes can be performed of printing the pretreat composition and conductive fusing agent composition onto the first portion of the powder bed to increase the amount of transition metal. Each pass of printing the pretreat composition and conductive fusing agent composition can be followed by a curing pass with the fusing lamp. Alternatively, a number of passes printing the conductive fusing agent composition onto the powder bed can be performed without fusing the bed between passes. This can allow the conductive fusing agent composition to penetrate more fully into the powder bed before the polymer powder is fused. For example, several passes can be performed with the conductive fusing agent composition and then the fusing lamp can be used to fuse the layer The number of passes used can depend on the desired conductivity, the contone level of the printing passes (referring to the density of ink per area deposited on each pass), the type of salt of alkali metal with bromide or iodide, the type of transition metal in the conductive fusing agent composition, concentration of transition metal in the conductive fusing agent composition, thickness of the layer of polymer powder being printed, and so on.

It is noted that, as used in this specification and the appended claims, the singular forms "a," "an," and "the" include plural referents unless the context clearly dictates otherwise.

As used herein, "liquid vehicle" or "ink vehicle" refers to a liquid fluid in which additives are placed to form jettable fluids, such as inks. A wide variety of liquid vehicles may be used in accordance with the technology of the present disclosure. Such liquid or ink vehicles may include a mixture of a variety of different agents, including, surfactants, solvents, co-solvents, anti-kogation agents, buffers, biocides, sequestering agents, viscosity modifiers, surface-active agents, water, etc. Though not part of the liquid vehicle per se, in addition to the colorants and energy absorbers, the liquid vehicle can carry solid additives such as polymers, latexes, UV curable materials, plasticizers, salts, etc.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe not only pigment colorants, but other pigments such as organometallics, ferrites, ceramics, etc. In one specific aspect, however, the pigment is a pigment colorant.

The term "fusing agent composition" can be a conductive fusing agent composition or a second fusing agent composition, or the like. Sometimes, the term "fusing agent composition" can be used generally to describe both types of compositions, or either type of composition, depending on the context.

As used herein, "soluble," refers to a solubility percentage of more than 5 wt %.

As used herein, "ink jetting" or "jetting" refers to compositions that are ejected from jetting architecture, such as ink-jet architecture. Ink-jet architecture can include thermal or piezo architecture. Additionally, such architecture can be configured to print varying drop sizes such as less than 10 picoliters, less than 20 picoliters, less than 30 picoliters, less than 40 picoliters, less than 50 picoliters, etc.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists can be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus is to be interpreted flexibly to include not only the numerical values explicitly recited as the limits of the range, but also to include individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

EXAMPLE

The following illustrates an example of the present disclosure. However, it is to be understood that the following is only illustrative of the application of the principles of the present disclosure. Numerous modifications and alternative compositions, methods, and systems may be devised without departing from the spirit and scope of the present disclosure. The appended claims are intended to cover such modifications and arrangements.

Example 1

An inkjet printer was used to print conductive traces onto a 1 mm thick nylon coupon that was manufactured from nylon powder (PA12) using a Stratsys® selective laser sintering printer. The inkjet printer printed a pretreat composition and a conductive fusing agent composition (or "conductive ink" in this example) from two separate inkjet printing slots. The drop weight of the pretreat composition was 50 ng, and the drop weight of the conductive ink was 9 ng. The conductive ink was a silver ink (Mitsubishi NBSIJ-MU01) containing silver nanoparticles. The silver nanoparticles had an average particle size of approximately 20 nm. Six different pretreat compositions were tested. The pretreat compositions were each a 5 wt % aqueous solution of a salt of an alkali metal with bromide or iodide. The salts tested included lithium bromide, potassium bromide, sodium bromide, lithium iodide, potassium iodide, and sodium iodide.

The pretreat composition and conductive ink were printed at a contone level of 255. The resistance of each trace was measured after 1 pass with the inks, after 2 passes with the inks, and after 3 passes with the inks. The resistance was measured by placing contacts of a digital multimeter approximately 1 cm apart on each conductive trace. Using the above printer settings, the amount of solid silver dispensed onto the powder was 47 mg/cm$^3$ of the powder layer per pass.

The resistances of the printed traces after 1, 2, and 3 passes are shown in Table 1.

TABLE 1

| Salt | R after 1 pass (ohms) | R after 2 passes (ohms) | R after 3 passes (ohms) |
| --- | --- | --- | --- |
| Lithium bromide | 150,000-250,000 | 80,000-140,000 | 80,000-135,000 |
| Potassium bromide | 80-160 | 15-19 | 3-5 |
| Sodium bromide | Open | 600,000-5,000,000 | 20-70 |
| Lithium iodide | 250,000-320,000 | 205,000-270,000 | 194,000-350,000 |
| Potassium iodide | Open | Open | 20,000-300,000 |
| Sodium iodide | Open | Open | 350-2,500 |

The line width of the printed traces after 1, 2, and 3 passes are shown in Table 2.

TABLE 2

| Salt | Line width after 1 pass (microns) | Line width after 2 passes (microns) | Line width after 3 passes (microns) |
| --- | --- | --- | --- |
| Lithium bromide | N/A | 746 | 777 |
| Potassium bromide | 770 | 785 | 786 |
| Sodium bromide | 776 | 801 | 836 |
| Lithium iodide | N/A | N/A | N/A |
| Potassium iodide | 734 | 769 | 750 |
| Sodium iodide | 702 | 720 | 767 |

The line width values identified as "N/A" for lithium bromide and lithium iodide were not measurable because the visible color of the lines printed using these salts faded before the line widths were measured.

The pretreat compositions including potassium bromide and sodium bromide provided the lowest resistance after 3 passes. Thus, these pretreat compositions can be especially useful for forming conductive features in 3-dimensional printed parts. Other pretreat compositions can also be useful for applications where a high resistance is desired, such as in 3-dimensional printed resistors. Furthermore, the line widths for all of the tested salts were suitable for 3-dimensional printing using the systems and processes described herein. Line width corresponds generally to print quality. In the application of the present technology, a narrow line width, such as the line widths achieved in this example, allows for printing quality parts with good resolution. When the conductive ink is printed onto the pretreated surface, the silver particles in the ink react with the salt, causing the silver particles to sinter together. However, the amount of salt and conductive ink can be balanced so that not all of the silver particles react and sinter immediately at the surface, but some of the silver particles can penetrate into the powder bed before reacting with the salt and sintering together. Thus, print quality and penetration of the powder bed layer can be balanced.

What is claimed is:

1. A material set, comprising:
    a thermoplastic polymer powder having an average particle size from 20 μm to 100 μm;
    a pretreat composition comprising a salt of an alkali metal with bromide or iodide; and
    a conductive fusing agent composition comprising a transition metal.

2. The material set of claim 1, further comprising a second fusing agent composition comprising an energy absorber capable of absorbing electromagnetic radiation to produce heat.

3. The material set of claim 2, wherein the second fusing agent composition provides a lower conductivity than the conductive fusing agent composition when printed on the thermoplastic polymer powder.

4. The material set of claim 2, wherein the energy absorber comprises carbon black, a near-infrared absorbing dye, a near-infrared absorbing pigment, a tungsten bronze, a molybdenum bronze, metal nanoparticles, a conjugated polymer, or combinations thereof.

5. The material set of claim 1, wherein the transition metal is in the form of elemental transition metal particles.

6. The material set of claim 5, wherein the salt is capable of activating the elemental transition metal particles.

7. The material set of claim 1, wherein the transition metal is in the form of silver particles, copper particles, gold particles, platinum particles, palladium particles, chromium particles, nickel particles, zinc particles, alloys thereof, or combinations thereof.

8. The material set of claim 1, wherein the salt comprises lithium bromide, lithium iodide, potassium bromide, potassium iodide, sodium bromide, sodium iodide, or combinations thereof.

9. A 3-dimensional printing system, comprising:
    a powder bed comprising a thermoplastic polymer powder having an average particle size from 20 μm to 100 μm;
    a fluid jet printer, comprising:
        a first fluid jet printing slot in communication with a reservoir of a pretreat composition to print the pretreat composition onto the powder bed, wherein the pretreat composition comprises a salt of an alkali metal with bromide or iodide, and
        a second fluid jet printing slot in communication with a reservoir of a conductive fusing agent composition to print the conductive fusing agent composition onto the powder bed, wherein the conductive fusing agent composition comprises a transition metal; and
    a fusing energy source to emit electromagnetic radiation sufficient to fuse thermoplastic polymer powder that has been printed with the conductive fusing agent composition.

10. The system of claim 9, further comprising a third fluid jet printing slot in communication with a reservoir of a second fusing agent composition to print the second fusing agent composition onto the powder bed, wherein the second fusing agent composition comprises an energy absorber capable of absorbing electromagnetic radiation to produce heat, and wherein the fusing energy source also emits electromagnetic radiation sufficient to fuse the thermoplastic powder that has been printed with the second fusing agent composition.

11. The system of claim 10, wherein the second fusing agent composition provides a lower conductivity than the conductive fusing agent composition when printed on the thermoplastic polymer powder.

12. The system of claim 9, further comprising a second fusing agent composition comprising an energy absorber capable of absorbing electromagnetic radiation to produce heat.

13. The system of claim 9, wherein the transition metal is in the form of elemental transition metal particles.

14. The system of claim 13, wherein the salt is capable of activating the elemental transition metal particles.

15. The system of claim 9, wherein the transition metal is in the form of silver particles, copper particles, gold particles, platinum particles, palladium particles, chromium particles, nickel particles, zinc particles, alloys thereof, or combinations thereof.

16. The system of claim 9, wherein the salt comprises lithium bromide, lithium iodide, potassium bromide, potassium iodide, sodium bromide, sodium iodide, or combinations thereof.

* * * * *